United States Patent
Astigarraga et al.

(10) Patent No.: US 9,946,819 B2
(45) Date of Patent: Apr. 17, 2018

(54) SIMULATING A LARGE NETWORK LOAD

(71) Applicant: INTERNATIONAL BUSINESS MACHINES CORPORATION, Armonk, NY (US)

(72) Inventors: Tara Astigarraga, Fairport, NY (US); Louie A. Dickens, Tucson, AZ (US); Michael E. Starling, Bonsall, CA (US); Daniel J. Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 547 days.

(21) Appl. No.: 14/590,314

(22) Filed: Jan. 6, 2015

(65) Prior Publication Data
US 2016/0196365 A1    Jul. 7, 2016

(51) Int. Cl.
G06F 9/44    (2006.01)
G06F 17/50    (2006.01)
H04L 12/24    (2006.01)
H04L 29/08    (2006.01)

(52) U.S. Cl.
CPC ........ G06F 17/5009 (2013.01); H04L 41/145 (2013.01); H04L 67/00 (2013.01)

(58) Field of Classification Search
None
See application file for complete search history.

(56) References Cited

U.S. PATENT DOCUMENTS

| | | | |
|---|---|---|---|
| 7,315,807 B1 * | 1/2008 | Lavallee | H04L 41/145 703/21 |
| 7,327,680 B1 * | 2/2008 | Kloth | H04L 47/10 370/235 |
| 7,478,018 B1 * | 1/2009 | Lavallee | H04L 12/2697 703/2 |
| 7,774,444 B1 * | 8/2010 | George | H04L 41/145 709/217 |
| 8,024,169 B2 * | 9/2011 | Galgali | H04L 41/046 703/21 |
| 8,379,658 B2 | 2/2013 | Schmidt et al. | |
| 8,593,964 B1 | 11/2013 | Sinha et al. | |
| 2002/0019958 A1 | 2/2002 | Cantwell et al. | |

(Continued)

OTHER PUBLICATIONS

Yin et al. Storage Area Network Extension over Passive Optical Networks (S-PONs) IEEE Applicants & Practice: Topics in Optical Communications, 2008, pp. 44-52.*
Guendert Troubleshooting Performance Problems With DASD Array Host Adapters Enterprise Tech Journal, Jun. 2013.*
Scheible, John, "FC-LS default Login parameters clarification," Accredited Standards Committee INCITS, National Committee for Information Technology Standards, Feb. 5, 2004.

(Continued)

*Primary Examiner* — Omar Fernandez Rivas
*Assistant Examiner* — Cuong Luu
(74) *Attorney, Agent, or Firm* — Matthew Zehrer

(57) ABSTRACT

Buffer credits are starved upon a storage area network (SAN) switch. The starved buffer credit restricts a SAN switch buffer and enables a smaller load to stress the SAN switch, effectively emulating a larger load. Credit starvation may partially inhibit a SAN switch from delivering frames resulting in the filling of the SAN switch buffer and corresponding computational stress. The emulated load allows for all ports of a SAN switch to be simultaneously tested without the need or expense of a large number computing devices stressing the SAN. The SAN switch may be located within a test SAN environment or may be located in a functioning SAN environment to determine SAN bottlenecks prior to critical loading.

18 Claims, 6 Drawing Sheets

(56) References Cited

U.S. PATENT DOCUMENTS

| | | | |
|---|---|---|---|
| 2002/0170004 A1 | 11/2002 | Parrett et al. | |
| 2004/0236880 A1* | 11/2004 | Barrett | G06F 11/0787 710/52 |
| 2006/0101140 A1* | 5/2006 | Gai | H04L 12/4633 709/224 |
| 2008/0089320 A1* | 4/2008 | Dehaan | H04L 41/145 370/360 |
| 2009/0043880 A1* | 2/2009 | Dickens | H04L 47/10 709/224 |
| 2013/0107890 A1* | 5/2013 | Hyoudou | H04L 47/17 370/412 |

OTHER PUBLICATIONS

Zhang, H. et al.; "Fibre channel storage area network design for an acoustic camera system with 1.6 Gbits/s bandwidth"; Proceedings of IEEE Region 10 International Conference on Elecrtrical and Electronic Technology; TENCON 2001; pp. 143-148; vol. 1; IEEE. 2001.

Mellish, B. et al.; "Implementing Fibre Channel Attachment on the ESS"; IBM Corporation, http://www.ibm.com/redbooks/sg24-6113-00 . . . Sep. 2000.

Wood, E. et al.; "XIV Storage System: A look into Fibre Channel and iSCSI Performance"; IBM Corporation, http://www.ibm.com/redbooks/redp5057-00 . . . 2014.

\* cited by examiner

*400*

| ELS COMMAND CODE *401* |
| --- |
| COMMON SERVICE PARAMETERS *402* |
| PORT NAME *414* |
| NODE or FABRIC NAME *403* |
| OBSOLETE *404* |
| CLASS 2 SERVICE PARAMETERS *405* |
| CLASS 3 SERVICE PARAMETERS *406* |
| AUXILIARY PARAMETER DATA *407* |
| VENDOR VERSION LEVEL *408* |
| SERVICES AVAILABILITY *409* |
| LOGIN EXTENSION DATA LENGTH *410* |
| RESERVED *411* |
| CLOCK SYNC QoS *412* |
| LOGIN EXTENSION DATA *413* |

*600*

| SERVICE PARAMETER | WORD 614 | BITS 612 | DEFAULT LOGIN VALUE 613 | PLOGI AND PLOGI LS_ACC PARAMETER APPLICABILITY 614 | | FLOGI PARAMETER APPLICABILILTY 615 | | FLOGI LS_ACC PARAMETER APPLICABILITY 616 | |
|---|---|---|---|---|---|---|---|---|---|
| | | | | CLASS | | CLASS | | CLASS | |
| | | | | 2 | 3 | 2 | 3 | 2 | 3 |
| FC-PH VERSION - OBSOLETE 601 | 0 | 31-16 | 2020h | n | n | n | n | n | n |
| BUFFER TO BUFFER CREDIT 602 | 0 | 15-0 | 0 or 1 | y | y | y | y | y | y |
| COMMOM FEATURES 603 | 1 | 31-16 | | | | | | | |
| CONTINUOUSLY INCREASING RELATIVE OFFSET 604 | 1 | 31 | 0 | y | y | n | n | n | n |
| CLEAN ADDRESS 605 | 1 | 31 | 0 | n | n | n | n | y | y |
| MULTIPLE N_PORT_ID SUPPORT 606 | 1 | 31 | 0 | n | n | y | y | n | n |
| RANDOM RELATIVE OFFSET 607 | 1 | 30 | 0 | y | y | n | n | n | n |
| VIRTUAL FABRICS BIT 608 | 1 | 30 | 0 | n | n | y | y | y | y |
| VALID VENDOR VERSION LEVEL 609 | 1 | 29 | 0 | y | y | y | y | n | n |
| MULTIPLE N_PORT_ID ASSIGNMENT 610 | 1 | 29 | 0 | n | n | n | n | y | y |

FIG. 6

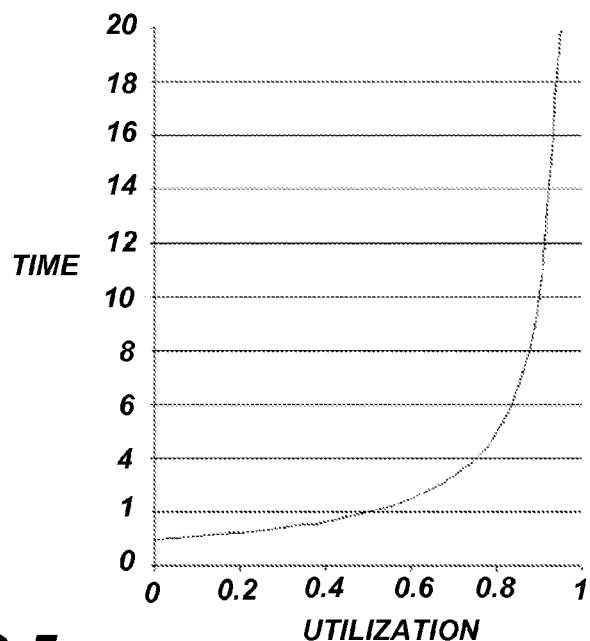

FIG. 7

SIMULATING A LARGE NETWORK LOAD

FIELD OF THE INVENTION

Embodiments of the invention generally relate to computer systems and more particularly to simulating a large network load in a storage area network (SAN).

DESCRIPTION OF THE RELATED ART

As the throughput of today's SAN switches increase, it is becoming more difficult to produce an adequate load upon the switch or switches in a test environment. Testing loaded switches may be desirable to find switch problems that may be encountered in a SAN where hundreds or thousands of servers are loading the SAN switches. Testing loaded switches may also be desirable to produce a stressed switch which may result in altered timings and or unique errors that surface under higher load.

Altered timing may result when a fully loaded switch cannot send frames as fast as the switch receives them. The fully loaded switch is forced to buffer frames, which, alters the timing of frame delivery. Unique errors may be seen as a direct result of the load. For example, stressed switches may drop frames when they cannot be delivered within a threshold time. As a result, multiple end devices may be performing error recovery processes and the stress switch may corrupt frames.

One solution to test loaded SAN switches is to add a large number of servers and storage devices to a SAN to produce a large enough load. Another current solution to test a loaded SAN switch is to utilize dedicated testing equipment designed to produce load on a port by port basis, such as load test equipment manufactured by JDSU Corporation.

SUMMARY

In an embodiment of the present invention, a method of simulating a large storage area network (SAN) load includes restricting, within a SAN switch, the utilization of a buffer by limiting the usable storage space of the buffer, receiving frames upon a plurality of SAN switch ports, and emulating a large SAN load by buffering the received frames within the restricted buffer.

In another embodiment, a computer program product for simulating a large storage area network (SAN) load includes a computer readable storage medium having program instructions embodied therewith, the program instructions readable by a SAN switch to cause the SAN switch to restrict the utilization of a buffer within the SAN switch by limiting the usable storage space of the buffer, to receive frames upon a plurality of SAN switch ports, and to emulate a large SAN load by buffering the received frames within the restricted buffer.

In yet another embodiment, a method of simulating of a large storage area network (SAN) load includes building, with a SAN device, a Fibre Channel frame and enabling a Buffer Credit Starvation Indicator, indicating, with the SAN device, a Percent of Buffer Utilization Indicator within the Fibre Channel frame, transmitting the Fibre Chanel frame to a SAN switch, restricting, within the SAN switch, the utilization of a SAN switch buffer by limiting the usable storage space of the buffer as indicated by the Buffer Credit Starvation Indicator and the Percent of Buffer Utilization Indicator, transmitting, with the SAN device, subsequent Fibre Channel frames to a plurality of SAN switch ports, and emulating a large SAN load by buffering the received frames within the restricted buffer.

These and other embodiments, features, aspects, and advantages will become better understood with reference to the following description, appended claims, and accompanying drawings.

BRIEF DESCRIPTION OF THE DRAWINGS

FIG. 6 illustrates common service parameter applicability for PLOGI, FLOGI, and FLOGI LS_ACC, according to various embodiments of the present invention.

FIG. 7 illustrates a utilization waveform, according to various embodiments of the present invention.

DETAILED DESCRIPTION

Embodiments of the invention generally relate to computer systems and more particularly to simulating a large network load in a SAN. More particularly, buffer credits may be starved upon a SAN switch. The starved buffer credit enables a smaller load to stress the SAN switch effectively emulating a larger load. Credit starvation may partially inhibit a SAN switch from delivering frames resulting in the filling of switch buffers and corresponding computational stress. The emulated load allows for all ports of a SAN switch to be simultaneously tested without the need or expense of a large number computing devices stressing the SAN. Further, the SAN switch with implemented starved buffer credit may be located within a testing environment or may be located in a functioning SAN to determine SAN bottlenecks prior to critical loading.

Figure 1:
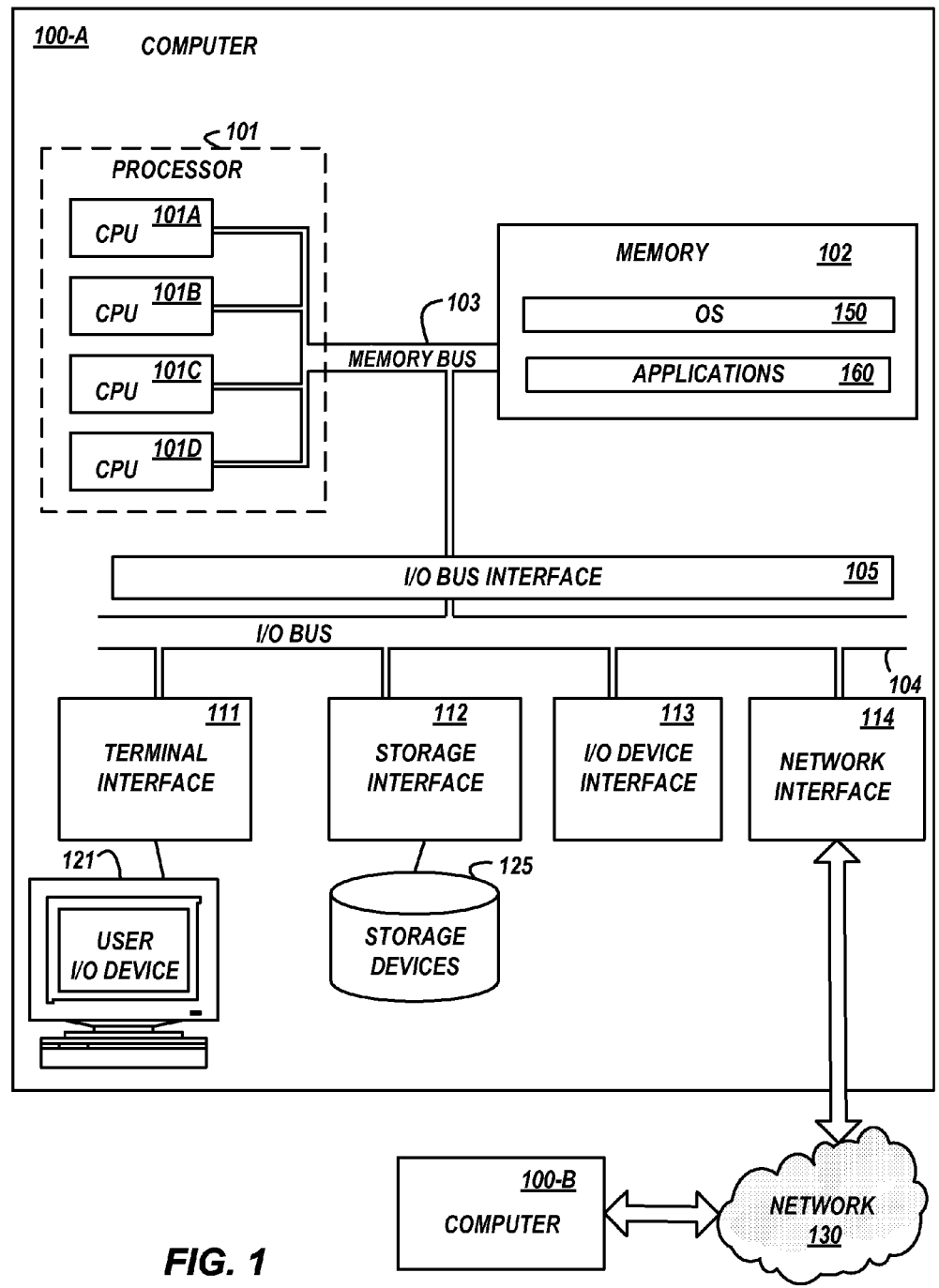
FIG. 1 illustrates a high-level block diagram of an exemplary computer system for implementing various embodiments of the invention.

Referring to the FIGs., wherein like numbers denote like parts throughout the several views, FIG. 1 depicts a high-level block diagram representation of a computer 100-A connected to another computer 100-B via a network 130, according to an embodiment of the present invention. The term "computer" is used herein for convenience only, and in various embodiments is a more general data handling system, such as a mobile phone, tablet, server computer, storage system, etc. The mechanisms and apparatus of embodiments of the present invention apply equally to any appropriate data handling system.

The major components of the computer 100-A may comprise one or more processors 101, a main memory 102, a terminal interface 111, a storage interface 112, an I/O (Input/Output) device interface 113, and a network adapter 114, all of which are communicatively coupled, directly or indirectly, for inter-component communication via a memory bus 103, an I/O bus 104, and an I/O bus interface unit 105. The computer 100-A contains one or more general-purpose programmable central processing units (CPUs) 101A, 101B, 101C, and 101D, herein generically referred to as the processor 101. In an embodiment, the computer 100-A contains multiple processors typical of a relatively large system; however, in another embodiment the computer 100-A may alternatively be a single CPU system. Each processor 101 executes instructions stored in the main memory 102 and may comprise one or more levels of on-board cache.

In an embodiment, the main memory 102 may comprise a random-access semiconductor memory, storage device, or storage medium for storing or encoding data and programs. In another embodiment, the main memory 102 represents the entire virtual memory of the computer 100-A, and may also include the virtual memory of other computer systems coupled to the computer 100-A or connected via the network 130. The main memory 102 is conceptually a single monolithic entity, but in other embodiments the main memory 102 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory 102 stores or encodes an operating system 150, an application 160, and/or other program instructions. Although the operating system 150, an application 160, etc. are illustrated as being contained within the memory 102 in the computer 100-A, in other embodiments some or all of them may be on different computer systems and may be accessed remotely, e.g., via the network 130. The computer 100-A may use virtual addressing mechanisms that allow the programs of the computer 100-A to behave as if they only have access to a large, single storage entity instead of access to multiple, smaller storage entities. Thus, while operating system 150, application 160, or other program instructions are illustrated as being contained within the main memory 102, these elements are not necessarily all completely contained in the same storage device at the same time. Further, although operating system 150, application 160, other program instructions, etc. are illustrated as being separate entities, in other embodiments some of them, portions of some of them, or all of them may be packaged together.

In an embodiment, operating system 150, an application 160, and/or other program instructions comprise instructions or statements that execute on the processor 101 or instructions or statements that are interpreted by instructions or statements that execute on the processor 101, to carry out the functions as further described below with reference to FIGs. When such program instructions are able to be run by the processor 101, such computer becomes a particular machine configured to carry out such instructions. For example, instructions for a user interface application may be loaded upon computer 100-A and a storage system application may be loaded upon one or more computers 100-B that causes the computer 100-A to storage data to computer 100-B over the network 130.

In some embodiments, one or more processors 101 may function as a general-purpose programmable graphics processor unit (GPU) that builds images (e.g. a GUI) for output to a display. The GPU, working in conjunction with one or more applications 160, determines how to manipulate pixels on e.g. display, touch screen, etc. to create a display image or user interface. Ultimately, the image may be displayed to a user. The processor 101 and GPU may be discrete components or may be integrated into a single component.

The memory bus 103 provides a data communication path for transferring data among the processor 101, the main memory 102, and the I/O bus interface unit 105. The I/O bus interface unit 105 is further coupled to the system I/O bus 104 for transferring data to and from the various I/O units. The I/O bus interface unit 105 communicates with multiple I/O interface units 111, 112, 113, and 114, which are also known as I/O processors (IOPs) or I/O adapters (IOAs), through the system I/O bus 104. The I/O interface units support communication with a variety of storage and I/O devices. For example, the terminal interface unit 111 supports the attachment of one or more user I/O devices 121, which may comprise user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 121 and the computer 100-A, and may receive output data via the user output devices. For example, a user interface may be presented via the user I/O device 121, such as displayed on a display device, played via a speaker, or printed via a printer. The user interface may be a user interface that provides content to a user visually (e.g. via a screen), audibly (e.g. via a speaker), and/or via touch (e.g. vibrations, etc.).

The storage interface unit 112 supports the attachment of one or more local disk drives or secondary storage devices 125. In an embodiment, the secondary storage devices 125 are rotating magnetic disk drive storage devices, but in other embodiments they are arrays of disk drives configured to appear as a single large storage device to a host computer, or any other type of storage device. The contents of the main memory 102, or any portion thereof, may be stored to and retrieved from the secondary storage devices 125, as needed. The local secondary storage devices 125 have a slower access time than does the memory 102, meaning that the time needed to read and/or write data from/to the memory 102 is less than the time needed to read and/or write data from/to for the local secondary storage devices 125.

The I/O device interface 113 provides an interface to any of various other input/output devices. The network adapter 114 provides one or more communications paths from the computer 100-A to other data handling devices such as numerous other computers; such paths may comprise, e.g., one or more networks 130. For example, network adapter 114 may be a SAN adapter that communicatively connects one or more storage devices 125 of computer system 100-B.

Although the memory bus 103 is shown in FIG. 1 as a relatively simple, single bus structure providing a direct communication path among the processors 101, the main memory 102, and the I/O bus interface 105, in fact the memory bus 103 may comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 105 and the I/O bus 104 are shown as single respective units, the computer 100-A may, in fact, contain multiple I/O bus interface units 105 and/or multiple I/O buses 104. While multiple I/O interface units are shown, which separate the system I/O bus 104 from various communications paths running to the various I/O devices, in other embodiments some or all of the I/O devices are connected directly to one or more system I/O buses.

Network interface 114 may contain electronic components and logic to adapt or convert data of one protocol on I/O bus 104 to another protocol on another bus. Therefore, network interface 114 may connect a wide variety of devices to computer 100-A and to each other such as, but not limited to, tape drives, a SAN network (e.g. switches, storage systems, etc.), optical drives, printers, disk controllers, other bus adapters, PCI adapters, workstations using one or more protocols including, but not limited to, Token Ring, Gigabyte Ethernet, Ethernet, Fibre Channel, SSA, Fiber Channel Arbitrated Loop (FCAL), Serial SCSI, Ultra3 SCSI, Infiniband, FDDI, ATM, 1394, ESCON, wireless relays, Twinax, LAN connections, WAN connections, high performance graphics, etc. In embodiments, network 130 is a SAN or other storage network.

Though shown as distinct entities, the multiple I/O interface units 111, 112, 113, and 114 or the functionality of the I/O interface units 111, 112, 113, and 114 may be integrated into a similar device.

In various embodiments, the computer 100-A is a multi-user mainframe computer system, a single-user system, a server computer, storage system, or similar device that has little or no direct user interface, but receives requests from other computer systems (clients). In other embodiments, the computer 100-A is implemented as a desktop computer, portable computer, laptop or notebook computer, tablet computer, pocket computer, telephone, smart phone, pager, automobile, teleconferencing system, appliance, or any other appropriate type of electronic device.

In embodiments, network 130 may be one or more suitable networks or combination of networks and may support any appropriate protocol suitable for communication of data and/or code to/from the computer 100-A and at least the computer 100-B. For example, network 130 may include a communication network (e.g., internet) and network 130 may include a storage network (e.g., SAN). In various embodiments, the network 130 may represent a data handling device or a combination of data handling devices, either connected directly or indirectly to the computer 100-A. In another embodiment, the network 130 may support wireless communications. In another embodiment, the network 130 may support hard-wired communications, such as a telephone line or cable. In another embodiment, the network 130 may be the Internet and may support IP (Internet Protocol). In another embodiment, the network 130 is implemented as a local area network (LAN) or a wide area network (WAN). In another embodiment, the network 130 is implemented as a hotspot service provider network. In another embodiment, the network 130 is implemented an intranet. In another embodiment, the network 130 is implemented as any appropriate cellular data network, cell-based radio network technology, or wireless network. In another embodiment, the network 130 is implemented as any suitable network or combination of networks. Although one network 130 is shown, in other embodiments any number of networks (of the same or different types) may be present.

FIG. 1 is intended to depict the representative major components of the computer 100-A. But, individual components may have greater complexity than represented in FIG. 1, components other than or in addition to those shown in FIG. 1 may be present, and the number, type, and configuration of such components may vary. Several particular examples of such additional complexity or additional variations are disclosed herein; these are by way of example only and are not necessarily the only such variations. The various program instructions implementing e.g. upon computer system 100 according to various embodiments of the invention may be implemented in a number of manners, including using various computer applications, routines, components, programs, objects, modules, data structures, etc. Computer 100-B may include similar, less, or additional components as compared with computer 100-A. In specific embodiments, computer 100-A may be a server, computer 100-B may be a storage system that may store data from computer 100-A, and network 130 includes a SAN to provide for the storage of data from server 100-A upon storage system 100-B.

Embodiments of the present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate exemplary architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
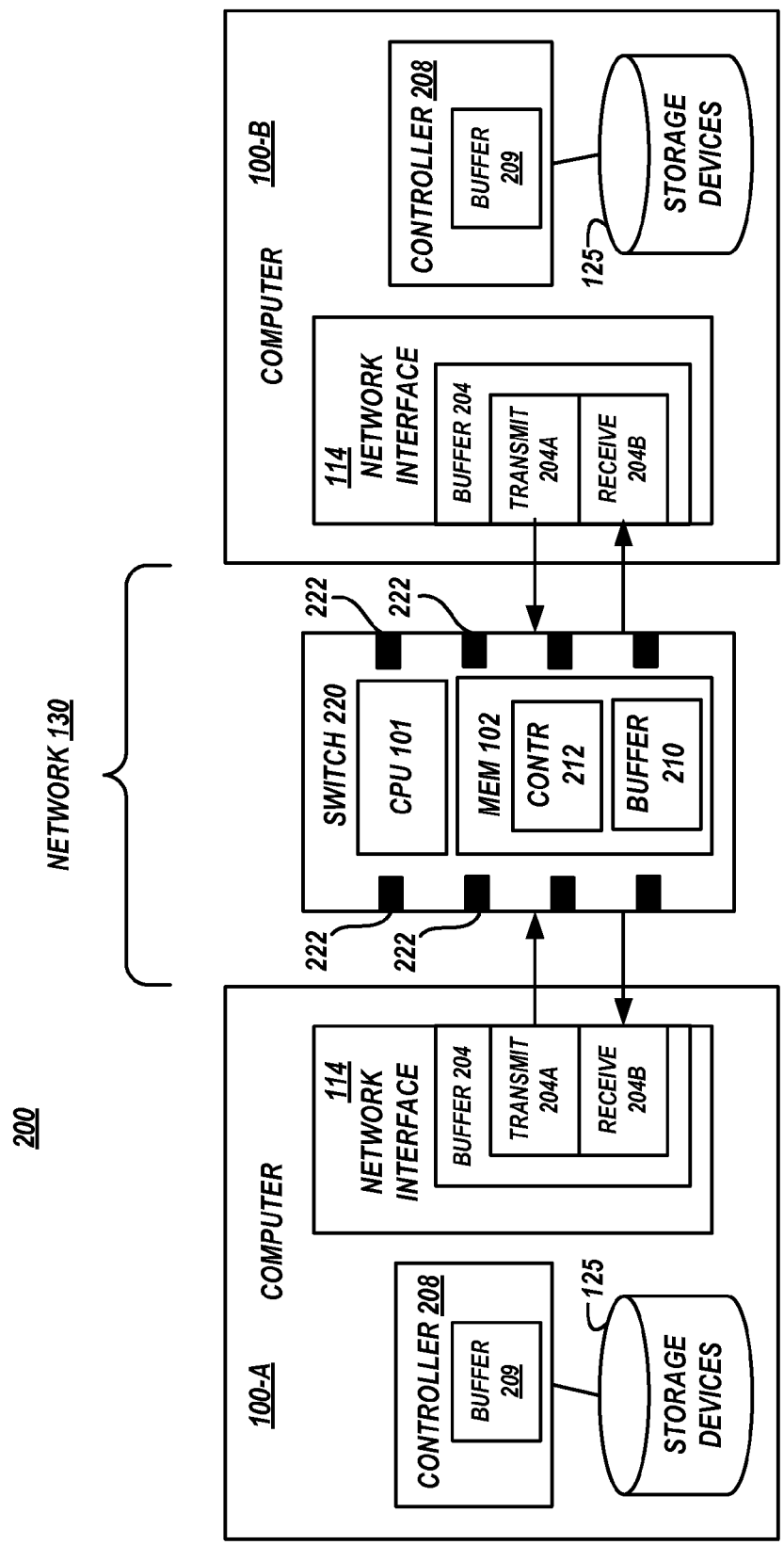
FIG. 2 illustrates an exemplary SAN, according to various embodiments of the present invention.

FIG. 2 illustrates a SAN environment 200 including a SAN network 130 that generally provides access to consolidated, block level data storage. SAN environment 200 may be used to enhance the storage capabilities of numerous computers. For example, storage devices, e.g., disk arrays, tape libraries, and optical jukeboxes, etc. within computer 100-B may appear like locally attached devices 125 to the operating system 150 of computer 100-A. SAN environment 200 may be used to increase storage capacity utilization, since multiple computers may consolidate storage space onto SAN storage devices 125. Common uses of a SAN environment 200 include provision of transactional accessed data that require high-speed block-level access to the hard drives such as email servers, databases, and high usage file servers.

SAN environment 200 may also provide the sharing of storage space to simplify storage administration. The SAN environment 200 could span a distant physical distance between the computer 100-A and the SAN storage devices 125 attached via the SAN network 130. This enables storage replication either implemented by disk array controllers, by server software, or by specialized SAN devices, such as a Fibre Channel switch. Most SANs 130 use the SCSI protocol for communication between computers 100 and SAN attached devices 125. A mapping layer to other protocols may be used to form SAN specific network 130, such as ATA over Ethernet (AoE), SCSI over Fibre Channel, Fibre Channel over Ethernet (FCoE), ESCON over Fibre Channel (FICON), HyperSCSI, iFCP, SANoIR iSCSI, etc.

SAN environment 200 often includes a fabric topology which is an infrastructure specially designed to route storage communications. A typical SAN fabric is made up of one or more switches 220.

In a particular embodiment, the SAN network 130 includes SAN storage devices 125 attached to one or more computers via one or more switches 220. Computer 100-A, and 100-B may include a controller 208 such as a storage controller that may manage or control the loading of data to SAN attached storage devices 125. The controller 208 may be connected to I/O bus 104, be included within e.g., storage interface 112, I/O interface 113, network interface 114, implemented by processor 101, etc.

In embodiments, the network interface 114 may further include a buffer 204 to store data to be transmitted by a transmit module 204A or to store data received from receive module 204B. Similarly, controller 208 may further include a buffer 209 to temporarily store data that will be loaded upon SAN storage devices 125 as directed by controller 208 or to temporarily store data from SAN storage devices 125 for further processing (e.g., provide data from SAN storage device 125 to a requesting computer 100-A via SAN 130, etc.).

Switch 220 may include a buffer 210 for temporality storing received data that is to be stored upon one or more SAN storage devices 125 or for temporality storing data received from SAN storage devices 125 that is to be provided to a requesting device. This data flow though the switch 200 may be managed by controller 212. Switch 220 may further include a plurality of ports 222 that provide for a communication interface with other SAN environment 200 components. In addition to processor 101 and memory 102, switch 220 may include similar components as e.g., computer 100-A.

Figure 3:
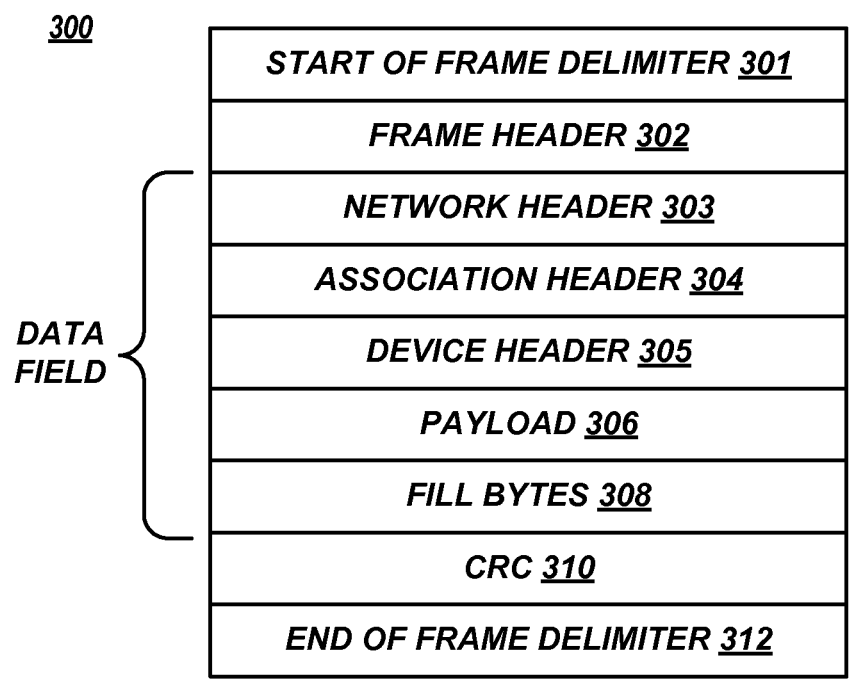
FIG. 3 illustrates a Fabric Log-In (FLOGI) Frame, according to various embodiments of the present invention.

FIG. 3 shows FLOGI frame 300. Frame 300 may be a Fibre Channel frame of the Fibre Channel protocol and may contain the information to be transmitted (Payload), the address of the source and destination ports and link control information. Frames are broadly categorized as data frames or link control frames. Data frames may be used as Link Data frames and Device Data frames. Link control frames are classified as Acknowledge (ACK) and Link Response (Busy and Reject) frames. The Fibre Channel Fabric (e.g., SAN network 130, etc.) may receive frame 300 from a source port and route the frame 300 to the destination port.

The frame 300 may begin and end with a respective Frame Delimiter. A Start of Frame Delimiter 301 may be an ordered set that immediately precedes the frame content and marks the beginning of the frame 300. A Frame Header 302 may immediately follow the Frame Delimiter 301. The Frame Header 302 may be used to control link applications, control device protocol transfers, detect missing or out of order frames, destination identifier, originating exchange, source identifier, etc.

Network Header 303 may also be known as the Ethernet Header, is an optional header whose presence may be indicated by a field in the Frame Header 302 and may be used for routing between Fibre Channel networks 130 of different Fabric address spaces, or Fibre Channel and non-Fibre Channel networks 130.

The Association Header 304 may be used to identify a specific process or group of processes within a node associated with an exchange. When the source port has indicated during Login that an Initial Process Associator is required to communicate with it, the Association Header 304 is used by the source port to identify a specific process or group of processes within a node associated with an exchange.

The Device Header 305 may contain FC-4/Upper layer protocol specific data based on a type field in the Frame Header 302. If present, the Device Header 305 may be present in either a first data frame or in all data frames of a sequence. Upper level protocol (ULP) types may also make use of the Device Header 305. The Device Header 305 may be ignored and skipped if not needed. If a Device Header 305 is present for a ULP that does not require it, the related FC-4 level of the Fibre Channel protocol may reject the frame 300.

Payload 306 contains data to be transferred from a source port to a destination port. A Cyclic Redundancy Check 310 precedes an End of Frame Delimiter 312 and may be used to detect transmission errors. A specific Payload 306 is further described in FIG. 4 and may contain the non-header contents of the data field of frame 300.

Fill Bytes 307 may be used to pad out frame 300 to a word boundary because of Fibre Channel requirements that all frames end on a 4-byte boundary. CRC 310 may be used to verify the data integrity of the data within the frame 300. The End of Frame delimiter 312 is represented by an Ordered Set that immediately follows the CRC 310. The End of Frame delimiter 312 Ordered Set may designate the end of the frame 310.

Figures 4, 5:
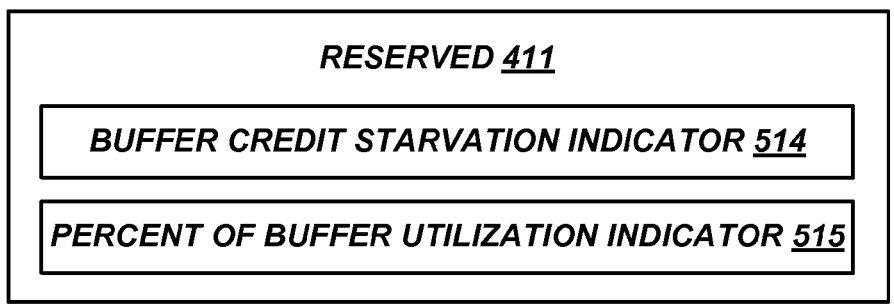
FIG. 4 illustrates a Port Log-In (PLOGI), Fabric Log-In (FLOGI), and Fabric Log-In Link-Service-Accept (FLOGI LS_ACC) Payload, according to various embodiments of the present invention.
FIG. 5 illustrates a buffer credit starvation scheme, according to various embodiments of the present invention.

In an exemplary embodiment, frame 300 includes the Start of Frame (SOF) delimiter 302 (e.g., 4 bytes), the Frame Header 302 (e.g., 24 bytes), the Network Header 303 (e.g., 16 bytes), the Association Header 304 (e.g., 32 bytes), the Device Header 305 (e.g., 16, 32, or 64 bytes), the Payload 306 (e.g., a FLOGI, Port Login (PLOGI), the Discover F_Port (FDISC), or Link Service Accept (LS_ACC) payload, etc.) further described in FIG. 4, the fill bytes 308 (e.g., 0-3 bytes), the Cyclical Redundancy Check (CRC) 310 (e.g., 4 bytes), and an End of Frame delimiter 312 (e.g., 4 bytes). In certain embodiments, the Network Header 303, Association Header 304, Device Header 305, and/or Fill Bytes 308 are optionally included in the frame 300. The frame 300 data field may include the Network Header 303, Association Header 304, Device Header 305, Payload 306, and/or Fill Bytes 308. The frame 300 data field may also include an Encapsulating Security Payload (ESP) Header and Trailer (not shown), which may be utilized to provide confidentiality, data origin, authentication, and anti-replay protection of Internet Protocol (IP) packets.

Referring to FIG. 4, in embodiments, payload 306 may be a FLOGI, PLOGI, FDISC, or LS_ACC payload frame 400. Payload frame 400 may include Extended Link Services (ELS) Command Code 401, Common Service Parameters (e.g., 16 bytes) 402, further discussed with regard to FIG. 6, Port Name 414, Node or Fabric Name 403, Obsolete or Class 1 Bytes 404, Class 2 Service Parameters 405 (e.g., 16 bytes), Class 3 Service Parameters 406 (e.g., 16 bytes), Auxiliary Parameter Data 407 (e.g., 16 bytes), Vendor Version Level 408 (e.g., 16 bytes), Service Availability 409 (e.g., 8 bytes), Login Extension Data Length 410, Reserved Bytes 411, Clock Synchronization QoS 412 (e.g., 8 bytes), and/or Login Extension Data 413.

ELS Command code 401 may be a 4-byte field (e.g., word 0) that identifies, for example, a PLOGI, FLOGI, or LS_ACC. An ELS may be assigned a code and may define the bits that follow ELS Command code 401.

The Port Name 414 may be an eight-byte field (e.g., words 5-6) that identifies a transmit port. Each transmit port that has a well known addresses may provide a Name Identifier. Transmit ports that are not assigned to a well known addresses may provide a Name Identifier that is unique within the Fibre Channel interaction space of the transmit port. Bits 63-60 may specify the format of the Name Identifier.

The Node Name or Fabric Name 403 may be an eight-byte field (e.g., words 7-8) that labels a Node or Fabric for identification purposes, such as diagnostics. The Node Name and Fabric Name 403 may be independent of and unrelated to network addressing. Each Node Name or Fabric Name 303 may be unique within the Fibre Channel interaction space. Bits 63-60 may specify the format of the name. Node Name may be applicable to PLOGI, PLOGI LS_ACC and FLOGI Fabric Name may be applicable to FLOGI LS_ACC. Class 1 or Obsolete 404 may be a 16-byte field (e.g, words 9-12) and is typically not utilized.

Class 2 Service Parameters 405 may be a 16-byte field (e.g., words 13-16). The Class 3 Service Parameters 406 may be a 16-byte field (e.g., words 17-20). The Class 2 Service Parameters 405 and Class 3 Service Parameters 406 are further described with reference to FIG. 6.

Auxiliary Parameter Data 407 may also be referred to as the Data Field Control (DF CTL) and may be a 16-byte field (e.g., words 21-24). Auxiliary Parameter Data 407 may specify whether the data portion of Payload 306 is used for a non-data purpose. It may also specify the first n number of bytes designated for the non-data purpose.

Vendor Version Level 408 may be a 16-byte field (e.g., words 25-28) and may specify vendor-specific information. If the Valid Version Level bit in the Common Service Parameters field 402 (i.e., word 1, bit 29) is active, the Vendor Version Level 408 contains valid information.

Services Availability 409 may be a 8-byte field (e.g., word 29-30) that returns information regarding the Fibre Channel Fabric's ability to route to defined well-known addresses and is useful for FLOGI LS_ACC.

Login Extension Data Length 410 may be an 8-byte field (e.g., word 31). If Login Extension Data Length 410 is non-zero, a Login Extension follows the normal payload. Login Extension Data Length 410 indicates the length of the Login Extension field in words. The Payload Bit located in the Common Service Parameters 402 may be set to active if this field is non-zero.

Reserved Bytes 411 may be 32 bits, or 4 bytes, per word. In one embodiment, the Reserved Bytes may include 30 words, for example Bits Word 32-61, thus resulting in 120 bytes total in reserve, for future use. The Reserved Bytes may include a Buffer-Credit Starvation indicator 514 and Percent of Buffer Utilization indicator 515, as is shown in FIG. 5.

Clock Synchronization Quality of Service (QoS) 412 may be a 8-byte field (e.g. word 62-63) for syncing the clock. Clock Synchronization QoS 412 revolves around a service, for example, a service that resides in a switch, called the Clock Synchronization Server. During the login process, Clock Synchronization QoS 412 is used to check if the Clock Synchronization Server exists.

Login Extension Data 413 is a field that may be specified by the any number of bytes located from word 64 and on. Login Extension Data 413 specifies additional data that may be necessary for a login, which extends the size of the login frame.

With reference to FIG. 5, in embodiments of the invention, the Buffer Credit Starvation Indicator 514 may be a bit that denotes whether buffer credit starvation is disabled or enabled. For example, disabled may be represented by the bit=0 and enabled may be represented by the bit=1, or visa versa. If the Buffer Credit Starvation Indicator 514 is active, applicable SAN environment 200 controllers (e.g. controller 212, controller 208, etc.) are effectively instructed to determine the percent of an associated buffer to utilize (between 0 and 100%) by querying Percent of Buffer to Utlization indicator 515. Percent of Buffer to Utilization indicator 515 is one or more bits that indicate the percentage of the associated buffer that is to be utilized. Thus, buffer credit starvation may be enabled via a FLOGI, PLOGI, FDISC, or a LS_ACC. Such buffer credit starvation may be applied to SAN environment 200 buffers (e.g., buffer 204, 209, 210, etc.).

In embodiments, a buffer credits allow for data communication in a Fibre Channel SAN. Latency may impose a distance limitation of a few kilometers between the source and the destination in the network. If the length of the fiber optic cable span exceeds this threshold, the throughput drops sharply. The buffer credit method allows the use of offsite storage facilities hundreds of kilometers away. In buffer credit flow control, a SAN 200 source and SAN 200 destination set the number of unacknowledged frames (buffer credits) allowed to accumulate before the SAN 200 source stops sending data. A counter at the SAN 200 source keeps track of the number of buffer credits. Each time a frame is sent by the SAN 200 source, the counter increments by 1. Each time the SAN 200 destination receives a frame, it sends an acknowledgment back to the SAN 200 source, which decrements the counter by 1. If the number of buffer credits reaches the maximum, the SAN 200 source stops transmission until it receives the next acknowledgement from the SAN 200 destination. In embodiments, Buffer Credit Starvation occurs when the transmitting port 222 runs out of buffer credits and isn't allowed to send frames. As such, the frames will be stored within the switch 220, blocking buffer 210 and eventually have to be dropped if they can't be sent for a certain time. In embodiments, when the Buffer Credit Starvation Indicator 514 is active the SAN switch 220 is placed into the mode where the transmitting port 222 has runs out of buffer credits.

FIG. 6 is a table 600 depicting a variety of Common Service Parameters 402. Common Service Parameters 402 may be defined by the Fibre Channel Link Services specification. Common Service Parameters 400 may include Fibre Channel Physical Interface (FC-PH) Version 601 (which may be obsolete and not used), Buffer-to-Buffer Credit 602 and Common Features 603. Common Features 603 may include Continuously Increasing Relative Offset 604, Clean Address 604, Multiple N Port ID Support 606, Random Relative Offset 607, Virtual Fabrics Bit 608, Valid Vendor Version Level 609, and Multiple N Port ID Assignment 610. Table 600 further depicts Word 611, Bits 612, Default Login Value 613 and the parameter applicability for PLOGI and PLOGI LS_ACC 614, FLOGI 615, AND FLOGI LS_ACC 616. Each parameter applicability 614, 615, 616 may be use in either Class 2 or Class 3 protocols, or both. Class 2 is an acknowledgement protocol, where every frame has an acknowledgement, which adds overhead. Class 3 is unacknowledged transmission of frames, which offers higher performance due to the absence of acknowledgments. The use of Class 3 is more prevalent for data transmission, with Class 2 being used for critical command and control.

The buffer-to-buffer Credit field 602 (e.g., word 0, bits 15-0) defines the number of buffers available for holding Class 2, or Class 3 frames received. An FC_Port tracks Buffer-to-buffer Credit 602 as a single entity for all frames subject to buffer-to-buffer flow control. Values in the Buffer-to-buffer Credit field 402 are 1 to 32,767. The value 0 is reserved.

Continuously increasing relative offset 604 may comprise a bit, for example word 1, bit 31. If the continuously increasing relative offset bit is active, the Nx_Port supplying this parameter is capable of supporting continuously increasing relative offset, if present, within a Sequence on a frame by frame SEQ_CNT (sequence count) basis. The continuously increasing relative offset 604 may only be applicable to those Information Categories in which an Nx_Port supports relative offset (i.e., word 2, bits 15-0).

Clean Address 605 (e.g., word 1, bit 31) is a bit that provides an indication to an Nx_Port as to whether the address it was assigned by the Fabric had been previously used by another device within a Resource_Allocation_Timeout value (R_A_TOV). If this bit is inactive, the assigned address may or may not have been used by a previous device within R_A_TOV. If this bit is active, the assigned address has not been used by any other device within R_A_TOV, or has been assigned to the current device for a previous FLOGI and not been changed within R_A_TOV. This bit is meaningful in FLOGI LS_ACC.

Multiple N_Port_ID Support 606 (e.g., word 1, bit 31) is a bit that is set to active to indicate that the PN_Port supplying this parameter is capable of requesting multiple N_Port_IDs using the FDISC ELS. The Multiple N_Port_ID Support 606 bit is set to inactive to indicate that the PN_Port supplying this parameter is not capable of requesting additional N_Port_IDs. Multiple N_Port_ID Support 606 is meaningful in FLOGI.

Random Relative Offset 407 (e.g., word 1, bit 30) is a bit that indicates the Nx_Port supplying the parameter shall be capable of supporting random relative offset values, if present. Random values may increase, decrease, or otherwise fluctuate within a Sequence. The Random Relative Offset 407 bit is applicable to those Information Categories in which an Nx_Port supports relative offset (i.e., word 3, bits 15-0).

Virtual Fabrics 608 (e.g., word 1, bit 30) is a bit that indicates support for virtual fabrics. Virtual fabrics, for example, may include Virtual Cluster Switching (VCS) Fabric technology which is a Layer 2 Ethernet technology designed to improve network utilization, maximize application availability, increase scalability, and dramatically simplify the network architecture in virtualized data centers. It comprises three pillars of innovation technology: Ethernet fabrics, Distributed Intelligence, and Logical Chassis. VCS Fabric technology is designed to incorporate a set of Dynamic Services for the highest level of functionality and investment protection for data centers, making it a core building block for virtualizing data center networks.

Valid Vendor Version Level 609 (e.g., world 1, bit 29) is a bit in PLOGI, PLOGI LS_ACC, and FLOGI that may be set active or inactive. If the Valid Vendor Version Level 609 bit is set active, the Vendor Version Level 408 contains valid information. If it is set inactive, the Vendor Version Level 408 is not meaningful.

Multiple N_Port_ID Assignment 610 (e.g., word 1, 29) is a bit that may be set active or inactive. When the Multiple N_Port_ID Support bit 606 in the FLOGI request is one, the Multiple N_Port_ID Assignment bit 610 is set active if the F_Port supplying this parameter is capable of assigning multiple N_Port_IDs to the attached PN_Port using the FDISC ELS. The Multiple N_Port_ID Assignment bit 610 is set inactive when the Multiple N_Port_ID Support bit 607 in the FLOGI request is inactive or to indicate that the F_Port is not capable of assigning multiple N_Port_IDs to the attached PN_Port when the Multiple N_Port_ID Support bit 607 in the FLOGI request is active. The Multiple N_Port_ID Assignment 410 bit is meaningful in the FLOGI LS_ACC.

In FIG. 6, "y" indicates yes, applicable (i.e., has meaning), "n" indicates no, not applicable (i.e., has no meaning). Further, Buffer-to-Buffer credit 602 equals one for all ports but an L_Port, and Buffer-to-buffer credit 602 equals zero for an L_Port.

FIG. 7 shows a buffer utilization waveform. The Y-axis is the total time normalized by the service time and the X-axis is utilization percentage. Buffer utilization approaches infinity as the utilization rate approaches one (i.e., 100%). When the buffer utilization rate is zero, the total time is equal to the service time because there is no buffer queuing. By starving buffer credits, we selectively increase the buffer utilization, which resultantly increases the queuing without the need for loading the switch 220 with additional workload, which is expensive to create.

Figure 8:
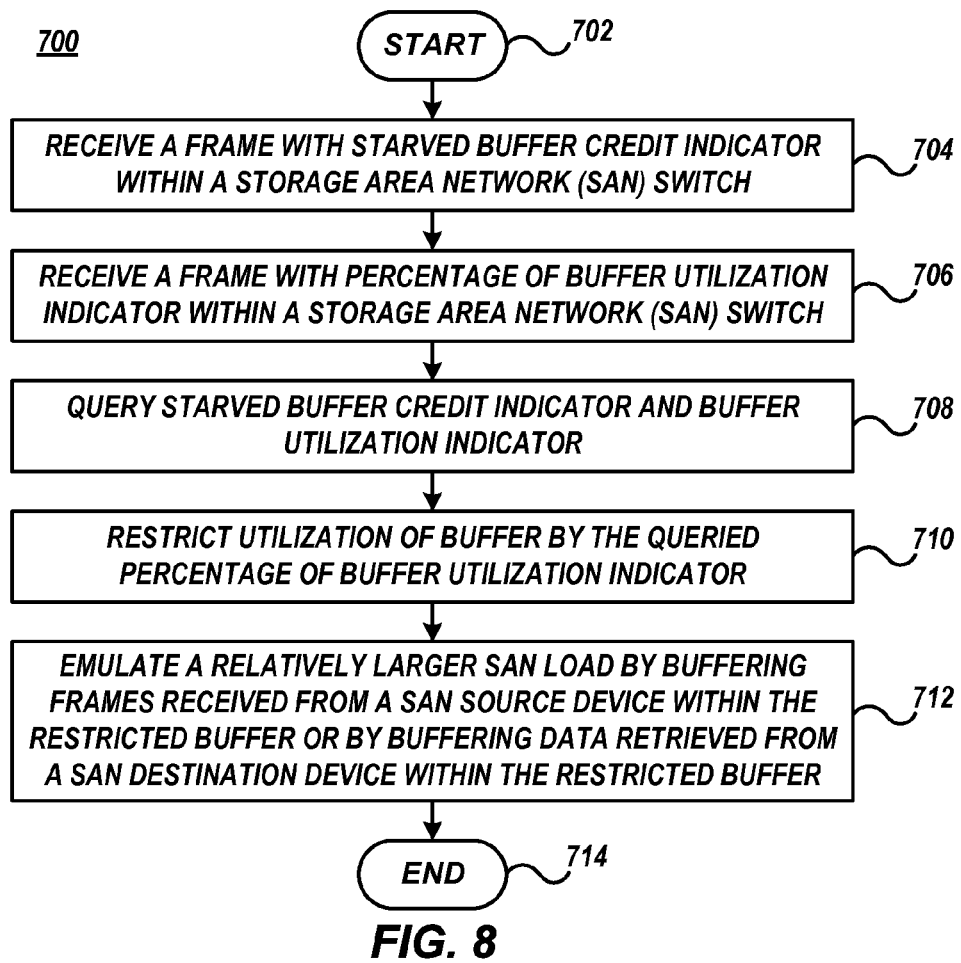
FIG. 8 illustrates an exemplary process for simulating a large network load, according to various embodiments of the present invention.

FIG. 8 illustrates an exemplary process 700 for simulating a large network load. Process 700 may be utilized to, for example, simulative a large network load upon a SAN switch 220 by restricting usage of a buffer (e.g., 204, 209, 210, etc.). The restricted buffer enables a smaller load to stress the SAN switch 220 effectively emulating a larger load. The restricted buffer may inhibit the SAN switch 220 from delivering frames, resulting in the filling of the buffer and corresponding computational stress. The emulated load allows for an all ports 222 of the SAN switch 220 to be simultaneously tested without the need or expense of a large number computing devices within the SAN environment 200.

Process 700 begins at block 702 and continues with a SAN switch 220 receiving a frame (e.g., frame 300) comprising a payload 306 with Buffer Credit Starvation Indicator 514 bit enabled or otherwise active (block 704). For example, computer 100-A may be communicatively connected to the SAN switch 200 and may activate the Credit Starvation Indicator 514 bit and transmit the frame 300 to the SAN switch 220.

Process 700 may continue with the SAN switch receiving a frame comprising a payload 306 that includes a Percent of Buffer Utilization indicator 515 bit or bits that indicate the percentage of a buffer that may be utilized (block 708). For example, computer 100-A may set the Percent of Buffer Utilization indicator 515 bit or bits and transmit a frame 300 to the SAN switch 200. For clarity, the Percent of Buffer Utilization indicator 515 bit or bits may indicate the percentage of the buffer that is utilized by alternatively indicating the percentage of the buffer shall not be utilized. In certain embodiments, the Percent of Buffer Utilization indicator 515 bit or bits may globally indicate the utilization percentage of all buffers within the SAN environment 200. For example, as the frame 300 is delivered to SAN environment 200 devices, the Percent of Buffer Utilization indicator 515 bit or bits may be queried with each SAN environment 200 device so that the device may determine the utilization percentage of its local buffers. In other embodiments, the Percent of Buffer Utilization indicator 515 bit or bits may locally indicate the utilization percentage of buffer 210 within the SAN switch 220.

Method 700 may continue by the recipient device querying to determine whether the Buffer Credit Starvation Indicator 514 bit is enabled or otherwise active. If the Buffer Credit Starvation Indicator 514 bit is enabled or otherwise active, the recipient device queries the Percent of Buffer Utilization indicator 515 bit or bits to determine the extent to which to starve an associated buffer(s) (block 708). For example, the SAN switch 220 interrogates the received frame and determines that the Buffer Credit Starvation Indicator 514 bit is enabled. As a result, the SAN switch 220 interrogates the received frame and determines that the Percent of Buffer Utilization indicator 515 bit or bits indicate that five percent of buffer 210 should be utilized while the other ninety five percent of the buffer should not be utilized. In other words, the Percent of Buffer Utilization indicator 515 bit or bits may indicate that buffer 210 should be restricted by ninety five percent.

Method 700 may continue by the recipient device restricting the usage of the associated buffer(s) as indicated by the Percent of Buffer Utilization indicator 515 bit or bits. For example, the address range of the buffer(s) may be partitioned into a first address range which may be demarked as blocked and inaccessible and into a second address range which may be demarked as unblocked and accessible. In certain embodiments, a controller associated with the buffer(s) effectively reduces the size of the buffer(s).

Method 700 may continue by emulating a relatively larger load by buffering or otherwise storing subsequent frames received from a source device within the SAN environment 200 within the restricted buffer and/or buffering or otherwise storing subsequent frames retrieved from a destination device within the SAN environment 200 within the restricted buffer (block 712). For example, subsequent Fibre Channel frames may be sent from respective transmit modules 204A from one or more source computers and received upon a plurality of ports 222 of switch 220. The frames may be temporarily stored within the restricted buffer 210 space and delivered via one or more ports 222 to a receive module 204B of one or more destination computers. The restricted buffer causes the relatively rapid filing of the buffer space (e.g. queues, etc.) and corresponding computational stress. In this manner, a relatively smaller load may produce a stress normally achieved with much larger loads. Method 700 ends at block 714.

Figure 9:
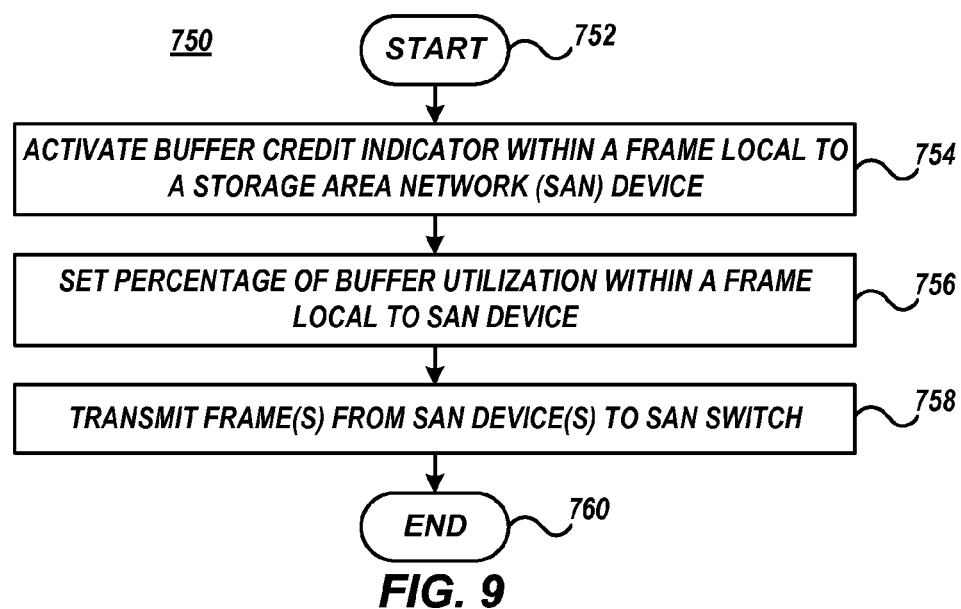
FIG. 9 illustrates an exemplary process for activating a Buffer Credit Starvation indicator and Percent of Buffer Utilization indicator, according to various embodiments of the present invention.

FIG. 9 illustrates an exemplary process 750 for activating a Buffer Credit Starvation indicator and Percent of Buffer Utilization indicator 515. Process 750 may be utilized to, for example, implement the simulation of a large network load within a SAN environment 200.

Process 750 begins at block 752 and continues with a SAN environment 200 device building a frame and enabling the Buffer Credit Starvation Indicator 514 bit therein (block 754). For example, computer 100-A may activate the Credit Starvation Indicator 514 bit. Process 750 may continue a SAN environment 200 device building a frame and setting the Percent of Buffer Utilization indicator 515 bit or bits therein (block 756). For example, computer 100-B may activate the Percent of Buffer Utilization indicator 515 bit or bits or computer 100-A may activate the Percent of Buffer Utilization indicator 515 bit or bits within the frame or a subsequent frame.

Process 750 may continue with the SAN device(s) transmitting the frame(s) to a SAN switch 220 (block 758). For example, computer 100-A may transmit the frame in which the Credit Starvation Indicator 514 bit is activated and computer 100-B may transmit the frame in which the Percent of Buffer Utilization indicator 515 bit or bits is set. Further, computer 100-A may transmit the frame in which the Credit Starvation Indicator 514 bit is activated and transmit the same (or different) frame in which the Percent of Buffer Utilization indicator 515 bit or bits is set. Process 750 ends at block 760.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over those found in the marketplace, or to enable others of ordinary skill in the art to understand the embodiments disclosed herein.

What is claimed is:

1. A method of simulating a storage area network (SAN) load comprising:
    receiving, with a SAN switch, an initial first frame comprising a Credit Starvation Indicator bit that when enabled places the SAN switch in an operating mode in which the SAN switch does not transmit frames;
    receiving, with the SAN switch, an initial second frame comprising a Percent of Buffer Utilization Indicator bit or bits;
    querying, with the SAN switch, the Credit Starvation Indicator bit(s), and if the Credit Starvation Indicator bit is enabled, querying the Percent of Buffer Utilization Indicator bit or bits to determine an extent to which a buffer is to be utilized and an extent to which the buffer is to be restricted;
    restricting, within the SAN switch, utilization of the buffer by limiting utilized storage space of the buffer by the extent designated by the Percent of Buffer Utilization Indicator bit or bits;
    receiving subsequent frames upon a plurality of SAN switch ports; and
    emulating a SAN load by buffering the received subsequent frames within the restricted buffer.

2. The method of claim 1, wherein restricting the utilization of the buffer by limiting the utilized storage space of the buffer further comprises:
    restricting with a controller a first buffer address range from being written to; and
    allowing with the controller a second address range to be written to and retrieved from.

3. The method of claim 1, wherein a first computer transmits the initial first frame comprising the Credit Starvation Indicator bit and the initial second frame comprising the Percent of Buffer Utilization Indicator bit or bits.

4. The method of claim 1, wherein a first computer transmits the initial first frame comprising the Credit Starvation Indicator bit(s) and a second computer transmits the initial second frame comprising the Percent of Buffer Utilization Indicator bit or bits.

5. The method of claim 1, wherein a first computer transmits the initial first frame comprising the Credit Starvation Indicator bit and subsequently transmits the initial second frame comprising the Percent of Buffer Utilization Indicator bit or bits.

6. The method of claim 1, wherein the initial first frame and the initial second frame are Fibre Channel frames.

7. The method of claim 1, wherein the initial first frame and the initial second frame are the same frame.

8. The method of claim 1, wherein the initial first frame and the initial second frame are different frames.

9. A computer program product for simulating a storage area network (SAN) load, the computer program product comprising a computer readable storage medium having program instructions embodied therewith, the program instructions readable by a SAN switch to cause the SAN switch to:
    receive an initial first frame comprising a Credit Starvation Indicator bit that when enabled places the SAN switch in an operating mode in which the SAN switch does not transmit frames;
    receiving an initial second frame comprising a Percent of Buffer Utilization Indicator bit or bits;
    query the Credit Starvation Indicator bit, and if the Credit Starvation Indicator bit is enabled, querying the Percent of Buffer Utilization Indicator bit or bits to determine an extent to which usable storage space of buffer is to be utilized and an extent to which the usable storage space of the buffer is to be restricted;
    restrict utilization of the buffer within the SAN switch by limiting the usable storage space of the buffer by the extent designated by the Percent of Buffer Utilization Indicator bit or bits;
    receive subsequent frames upon a plurality of SAN switch ports; and
    emulate a SAN load by buffering the received subsequent frames within the restricted buffer.

10. The computer program product of claim 9, wherein the program instructions to restrict the utilization of a buffer within the SAN switch by limiting the usable storage space of the buffer further cause the SAN switch to:
    restrict, with a SAN switch controller, a first buffer address range from being written to, and;

allow, with the SAN switch controller, a second address range to be written to and retrieved from.

11. The computer program product of claim 9, wherein a first computer transmits the initial first frame comprising the Credit Starvation Indicator bit and the second initial frame comprising the Percent of Buffer Utilization Indicator bit or bits.

12. The computer program product of claim 9, wherein a first computer transmits the initial first frame comprising the Credit Starvation Indicator bit and a second computer transmits the initial second frame comprising the Percent of Buffer Use Utilization Indicator bit or bits.

13. The computer program product of claim 9, wherein a first computer transmits the initial first frame comprising the Credit Starvation Indicator bit and subsequently transmits the initial second frame comprising the Percent of Buffer Utilization Indicator bit or bits.

14. The computer program product of claim 9, wherein the initial first frame and the initial second frame are is a Fibre Channel frames.

15. The computer program product of claim 9, wherein the initial first frame and the initial second frame are the same frame.

16. The computer program product of claim 9, wherein the initial first frame and the initial second frame are different frames.

17. A method of simulating of a storage area network (SAN) load comprising:
building, with a SAN switch, a Fibre Channel frame and enabling a Buffer Credit Starvation Indicator to place a SAN switch receiving the Fibre Channel frame in an operating mode in which the SAN switch does not transmit Fibre Channel frames:
enabling, with the SAN device, a Percent of Buffer Utilization Indicator bit or bits within the Fibre Channel frame to indicate an extent to which usable storage space of a buffer within the SAN switch is to be utilized and an extent to which the usable storage space of the buffer within the SAN switch is to be restricted:
transmitting the Fibre Chanel frame to the SAN switch;
restricting, within the SAN switch, utilization of the SAN switch buffer by limiting the usable storage space of the SAN switch buffer by the extent designated by the Percent of Buffer Utilization Indicator bit or bits;
transmitting, with the SAN switch, subsequent Fibre Channel frames to a plurality of SAN switch ports; and
emulating a SAN load upon the SAN switch by buffering the received frames within the restricted buffer of the SAN switch.

18. The method of claim 17, wherein restricting the utilization of the SAN switch buffer by limiting the usable storage space of the buffer further comprises:
querying the Credit Starvation Indicator bit, and;
if the Credit Starvation Indicator bit is enabled, querying the Percent of Utilization Indicator bit or bits to determine the extent to which the usable storage space of the buffer of the SAN switch is to be limited.

* * * * *